`US010666140B2`

United States Patent
Cho

(10) Patent No.: US 10,666,140 B2
(45) Date of Patent: May 26, 2020

(54) POWER CONVERTER WITH AT LEAST FIVE ELECTRICAL CONNECTIONS ON A SIDE

(71) Applicant: Infineon Technologies Americas Corp., El Segundo, CA (US)

(72) Inventor: Eung San Cho, Torrance, CA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 350 days.

(21) Appl. No.: 15/243,242

(22) Filed: Aug. 22, 2016

(65) Prior Publication Data

US 2018/0054120 A1   Feb. 22, 2018

(51) Int. Cl.
    *H02M 3/158*      (2006.01)
    *H03K 7/08*       (2006.01)
    *H02M 7/537*      (2006.01)

(52) U.S. Cl.
    CPC .............. *H02M 3/158* (2013.01); *H03K 7/08* (2013.01); *H01L 2224/40245* (2013.01); *H02M 7/537* (2013.01)

(58) Field of Classification Search
    None
    See application file for complete search history.

(56) References Cited

U.S. PATENT DOCUMENTS

| 7,301,235 | B2  | 11/2007 | Schaffer et al. |
| 7,804,131 | B2  | 9/2010  | Cheah et al. |
| 7,943,955 | B2  | 5/2011  | Haeberlen et al. |
| 8,426,914 | B2* | 4/2013  | Lin ..................... H01L 23/4952 257/334 |
| 2014/0110788 | A1* | 4/2014 | Cho ........................ H01L 24/18 257/368 |
| 2015/0270249 | A1* | 9/2015 | Cho ..................... H01L 25/072 327/109 |
| 2016/0036331 | A1* | 2/2016 | Saito .................... H01L 23/495 323/271 |

FOREIGN PATENT DOCUMENTS

| CN | 203179873 U | 9/2013 |
| EP | 3007223 A1  | 4/2016 |

OTHER PUBLICATIONS

Office Action, in the German language, from counterpart German Application No. 102017214236.7, dated Mar. 11, 2019, 8 pp.
Office Action, in the Chinese language, from counterpart Chinese Application No. 201710717739.8, dated Jun. 18, 2019, 8 pp.

\* cited by examiner

*Primary Examiner* — Walter H Swanson
*Assistant Examiner* — Kien C Ly
(74) *Attorney, Agent, or Firm* — Shumaker & Sieffert, P.A.

(57) ABSTRACT

In some examples, a device comprises an integrated circuit comprising a first transistor and a second transistor. The device further comprises an inductor comprising a first inductor terminal and a second inductor terminal, wherein the first inductor terminal is electrically connected to the first transistor and the second transistor. The device further comprises at least five electrical connections on a first side of the device.

21 Claims, 8 Drawing Sheets

US 10,666,140 B2

POWER CONVERTER WITH AT LEAST FIVE ELECTRICAL CONNECTIONS ON A SIDE

TECHNICAL FIELD

This disclosure relates to semiconductor packaging, and more specifically semiconductor packages for power electronics.

BACKGROUND

A half-bridge circuit may include two analog devices or switches. Half-bridge circuits may be used in power supplies for motors, in rectifiers, and for power conversion. Each half-bridge circuit package has several contacts and may include several conductive paths to connect the contacts to each other and to external components.

Surface-mount technology (SMT) is a production method for electronics that involves attaching components and devices on a printed circuit board (PCB). Components and devices may be soldered on the PCB to provide stability and electrical connections through the traces in the PCB.

SUMMARY

This disclosure describes techniques for a device comprising an integrated circuit (IC) comprising a first transistor and a second transistor. The device further comprises an inductor comprising a first inductor terminal and a second inductor terminal, wherein the first inductor terminal is electrically connected to the first transistor and the second transistor. The device further comprises at least five electrical connections on a first side of the device.

In some examples, a method comprises forming an IC comprising a first transistor and a second transistor. The method further comprises electrically connecting a first inductor terminal of an inductor to the first transistor and the second transistor to form a device. A first side of the device comprises at least five electrical connections.

In some examples, a power converter device comprises an IC comprising a first vertical power transistor and a second vertical power transistor, wherein the first vertical power transistor comprises a first control terminal, a first drain terminal, and a first source terminal, and the second vertical power transistor comprises a second control terminal, a second drain terminal, and a second source terminal. The power-converter device further comprises an inductor comprising a first inductor terminal and a second inductor terminal, wherein the first inductor terminal is electrically connected to the first source terminal and the second drain terminal. The power-converter device further comprises at least five electrical connections on a first side of the power-converter device, wherein the at least five electrical connections comprise a first electrical connection to the first control terminal, a second electrical connection to the second control terminal, a third electrical connection to the first drain terminal, and a fourth electrical connection to the second source terminal.

The details of one or more examples are set forth in the accompanying drawings and the description below. Other features, objects, and advantages will be apparent from the description and drawings, and from the claims.

DETAILED DESCRIPTION

Figure 1:
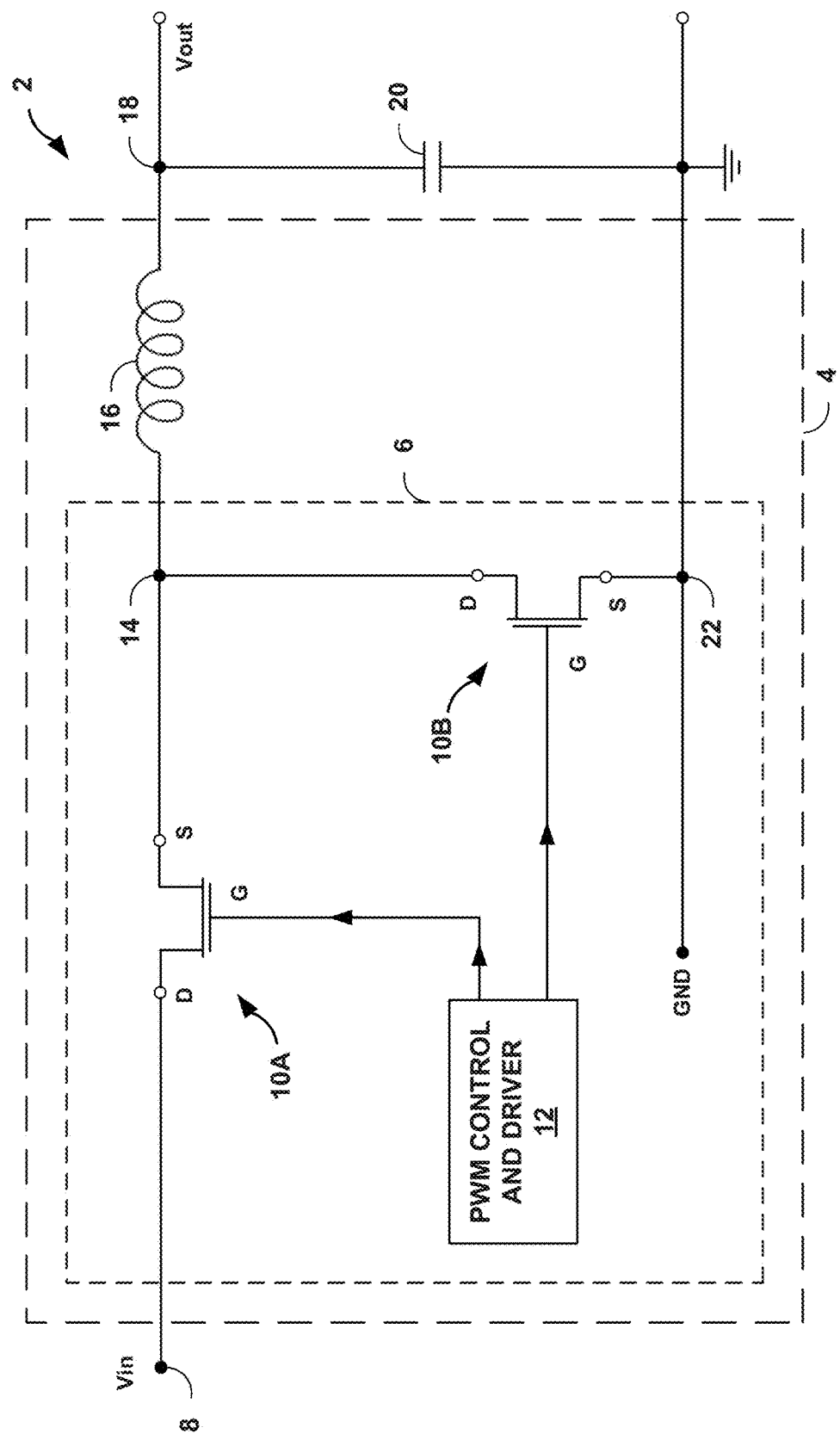
FIG. 1 is a circuit diagram of a power converter, in accordance with some examples of this disclosure.

FIG. 1 is a circuit diagram of a power converter 2, in accordance with some examples of this disclosure. In some examples, power converter 2 may comprise a half-bridge direct-current-to-direct-current (DC-to-DC) buck converter for converting an input DC signal to an output DC signal with a lower voltage. As a DC-to-DC buck converter, power converter 2 may operate as a voltage regulator in a variety of applications. As a DC-to-DC buck converter, a voltage amplitude of an input DC signal may be higher than a voltage amplitude of an output DC signal. However, the techniques of this disclosure may apply to other circuits and configurations, such as other power converters, including multi-phase power converters.

Power converter 2 may include device 4, which may include integrated circuit (IC) 6. Power converter 2 may include transistors 10A, 10B, inductor 16, capacitor 20, and pulse-width modulation (PWM) control and driver 12. In some examples, power converter 2 may contain more or fewer components than the components depicted in FIG. 1. Power converter 2 may include input node 8, output node 18, and reference node 22, as well as other nodes not shown in FIG. 1. Nodes 8, 18, 22 may be configured to connect to external components. For example, input node 8 may connect to an input voltage such as a power supply, output node 18 may connect to an electronic device, reference node 22 may connect to a reference voltage, such as reference ground. In some examples, PWM control and driver 12 may connect to an external circuit to a node (not shown in FIG. 1).

Transistors 10A, 10B may comprise metal-oxide semiconductor (MOS) field-effect transistors (FETs), bipolar junction transistors (BJTs), insulated-gate bipolar transistors (IGBTs), high-electron-mobility transistors (HEMTs), gallium-nitride (GaN) based transistors, and/or other elements that use voltage for control. Transistors 10A, 10B may comprise n-type transistors or p-type transistors, and transistors 10A, 10B may comprise vertical power transistors. For a vertical power transistor, the source terminal and the drain terminal may be on opposite sides or opposite surfaces of the transistor. Current in a vertical power transistor may flow through the transistor from top to bottom or from bottom to top. In some examples, transistors 10A, 10B may comprise other analog devices such as diodes. Transistors 10A, 10B may also include freewheeling diodes connected in parallel with transistors to prevent reverse breakdown of transistors 10A, 10B. In some examples, transistors 10A, 10B may operate as switches or as analog devices. In still other examples, transistors 10 may include more than two transistors, such as in multi-phase power converters or other more complex power circuits. For example, in a multi-phase power converter, power converter 2 may have one high-side transistor and one low-side transistor for each phase. Therefore, a multi-phase power converter may include one or more replications of power converter 2 as depicted in FIG. 1.

FIG. 1 depicts transistors 10A, 10B with three terminals: drain (D), source (S), and gate (G). Current may flow between the drain and source of transistors 10A, 10B, based on the voltage at the gate. Current may flow from input node 8 to switch node 14, through the drain and source of transistor 10A, based on the voltage at the gate of transistor 10A. Current may flow from switch node 14 to reference node 22, through the drain and source of transistor 10B, based on the voltage at the gate of transistor 10B. Transistor 10A may comprise a high-side transistor, and transistor 10B may comprise a low-side transistor because transistor 10B is connected to reference node 22.

Transistors 10A, 10B may comprise various material compounds, such as silicon (Si), silicon carbide (SiC), Gallium Nitride (GaN), or any other combination of one or more semiconductor materials. To take advantage of higher power density requirements in some circuits, power converters may operate at higher frequencies. Improvements in magnetics and faster switching, such as Gallium Nitride (GaN) switches, may support higher frequency converters. These higher frequency circuits may require control signals to be sent with more precise timing than for lower frequency circuits.

PWM control and driver 12 may deliver signals and/or voltages to the control terminals of transistors 10A, 10R FIG. 1 depicts PWM control and driver 12 as one component, but the PWM control circuit and the driver circuit may be separate components. In some examples, PWM control and driver 12, only the PWM control circuit, or only the driver circuit may be located outside of power converter 2 or outside of IC 6.

Inductor 16 may comprise a coil inductor that is outside of IC 6. Inductor 16 may connect to switch node 14 and output node 18. Inductor 16 may impede the flow of alternating-current (AC) electricity, while allowing DC electricity to flow between switch node 14 and output node 18.

Capacitor 20 may comprise a film capacitor, an electrolytic capacitor, a ceramic capacitor, or any other suitable type of capacitor or capacitors that is outside of IC 6 and device 4. Capacitor 20 may be an optional component in power converter 2. Capacitor 20 may connect to output node 18 and reference node 22. Capacitor 20 may impede the flow of DC electricity, while allowing AC electricity to flow between output node 18 and reference node 22. Capacitor 20 may act as a smoothing capacitor for the voltage at output node 18 to moderate fluctuations in the voltage at output node 18. Capacitor 20 may be an optional component outside of power converter 2.

Figure 2:
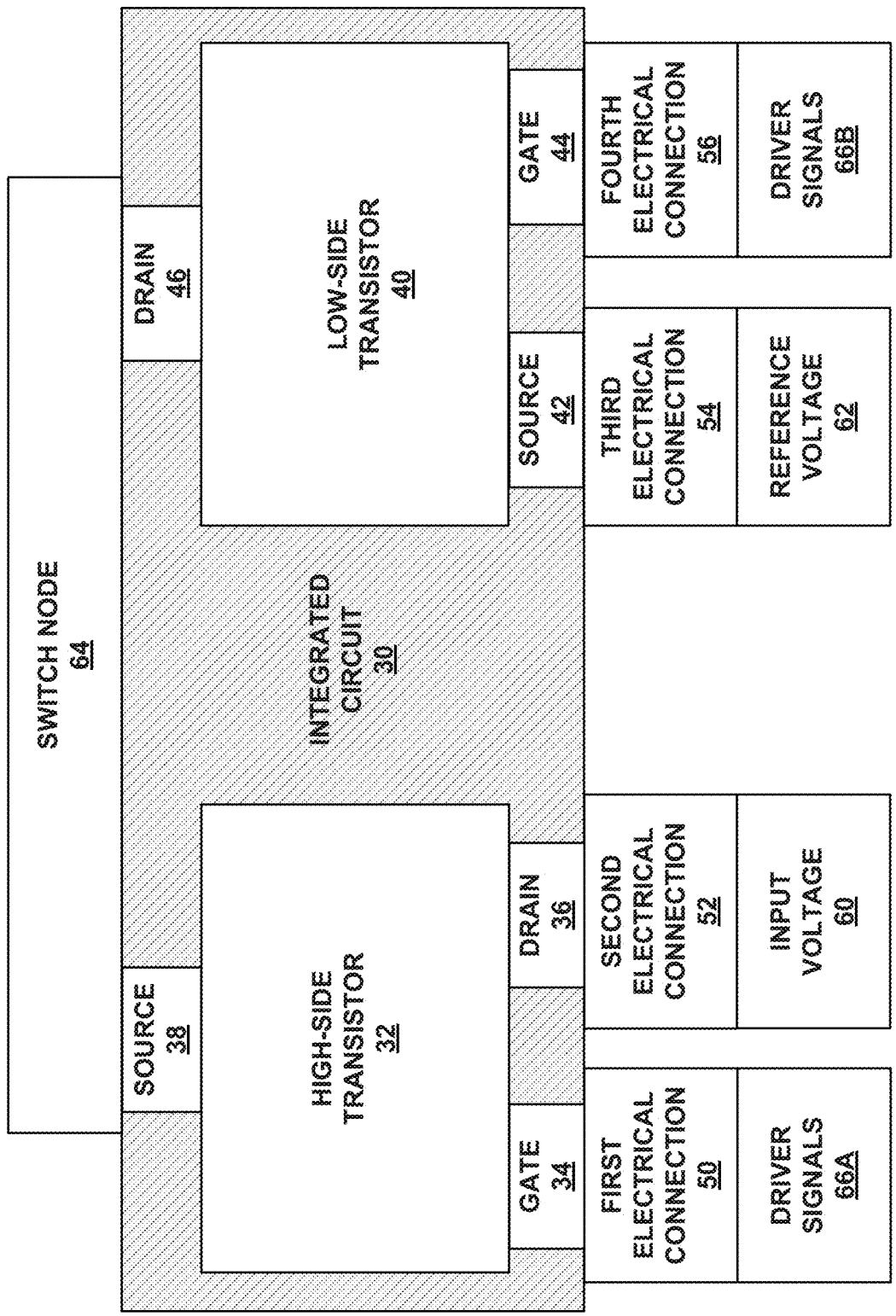
FIG. 2 is a block diagram of an integrated circuit (IC) comprising two transistors, in accordance with some examples of this disclosure.

FIG. 2 is a block diagram of an integrated circuit (IC) 30 comprising two transistors 32, 40, in accordance with some examples of this disclosure. Transistors 32, 40 may comprise vertical transistors that are integrated into IC 30. IC 30 may comprise silicon or any other suitable semiconductor.

Transistors 32, 40 may each have a control terminal, such as gate terminals 34, 44. Each of transistors 32, 40 may comprise two load terminals, such as a source and a drain. Each of transistors 32, 40 may comprise vertical power transistors, such as vertical power FETs, with current traveling from one side of IC 30 to an opposite side of IC 30. Each of the control terminals and load terminals of transistors 32, 40 may comprise a pad or area at the surface of IC 30 to form external electrical connections. High-side transistor 32 may function in a manner similar to transistor 10A in FIG. 1, and low-side transistor 40 may function in a manner similar to transistor 10B in FIG. 1. In some examples, transistors 32, 40 may be MOSFETs, BJTs, IGBTs, and/or any suitable type of transistor. If transistors 32, 40 are bipolar transistors, each control terminal may be a base and the load terminals may be emitters and collectors.

Transistors 32, 40 may be configured such that the source terminal 38 is electrically connected to the drain terminal 46 by switch node 64. Switch node 64 may comprise a metallization layer, a clip, a ribbon, a die paddle, a wire bond, and/or any other suitable conductive material. Switch node 64 may be on an opposite side of IC 30 from the control terminals and drain terminal 36 and source terminal 42. In some examples, source terminal 38 and drain terminal 46 may be electrically connected through switch node 64 to an inductor (not shown in FIG. 2).

As depicted in FIG. 2, IC 30 may comprise at least four electrical connections on one side. Gate terminal 34 may connect through first electrical connection 50 and be configured to receive driver signals 66A, which may originate from an external driver circuit (not shown in FIG. 2). Drain terminal 36 may connect through second electrical connection 52 and be configured to receive input voltage 60, which may comprise a DC electricity signal. Source terminal 42 may connect through third electrical connection 54 and be configured to receive reference voltage 62. Gate terminal 44 may connect through fourth electrical connection 56 and be configured to receive driver signals 66B, which may originate from an external driver circuit. In some examples, IC 30 may comprise more than one electrical connection for one or both of input voltage 60 and reference voltage 62 for current mirroring.

Figure 3:
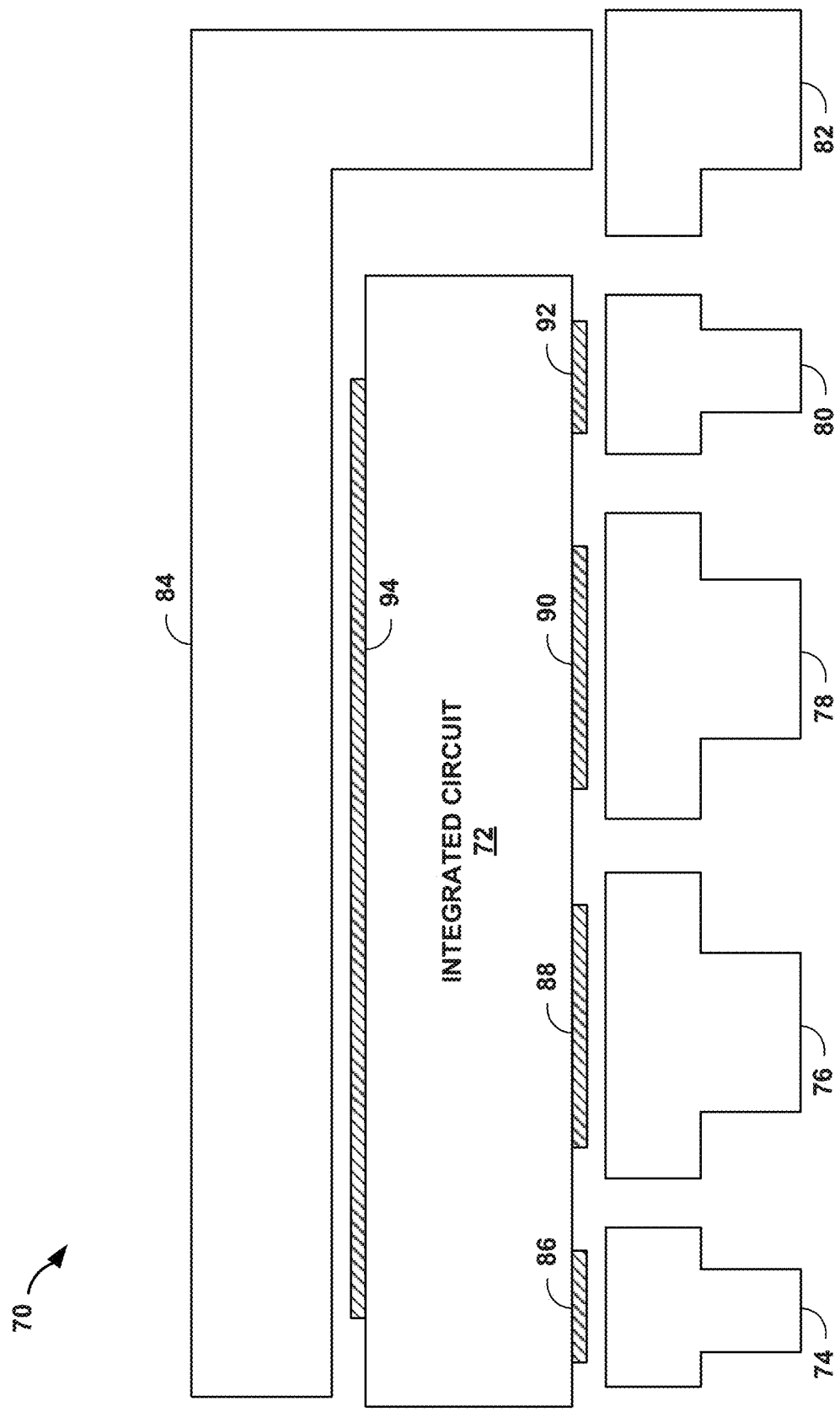
FIG. 3 is a side-view diagram of a device comprising at least five electrical connections on a side, in accordance with some examples of this disclosure.

FIG. 3 is a side-view diagram of a device 70 comprising at least five electrical connections on a side 99, in accordance with some examples of this disclosure. Device 70 may comprise IC 72 comprising electrical connections 74, 76, 78, 80 on side 99. IC 72 may also connect to electrical connection 82 on side 99 through clip 84. IC 72 may connect to electrical connections 74, 76, 78, 80 and clip 84 through conductive pads 86, 88, 90, 92, 94.

Electrical connections 74, 76, 78, 80, 82 may comprise a leadframe, metallization layers, clips, ribbons, die paddles, wire bonds, a premolded leadframe, laminate substrate, and/or any other suitable conductive materials. Clip 84 may comprise a metallization layer, a ribbon, a die paddle, a wire bond, and/or any other suitable conductive material. Clip 84 may be partially encapsulated in an insulating layer for electrical insulation and partially exposed for improved thermal dissipation. Clip 84 may electrically connect a switch node on IC 72 to electrical connection 82, which may be on the same side of device 70 as electrical connections 74, 76, 78, 80. Conductive pads 86, 88, 90, 92, 94 may comprise solder, metallization layers, conductive tape, conductive paste, conductive adhesive, and/or any other suitable conductive material.

Figure 4:
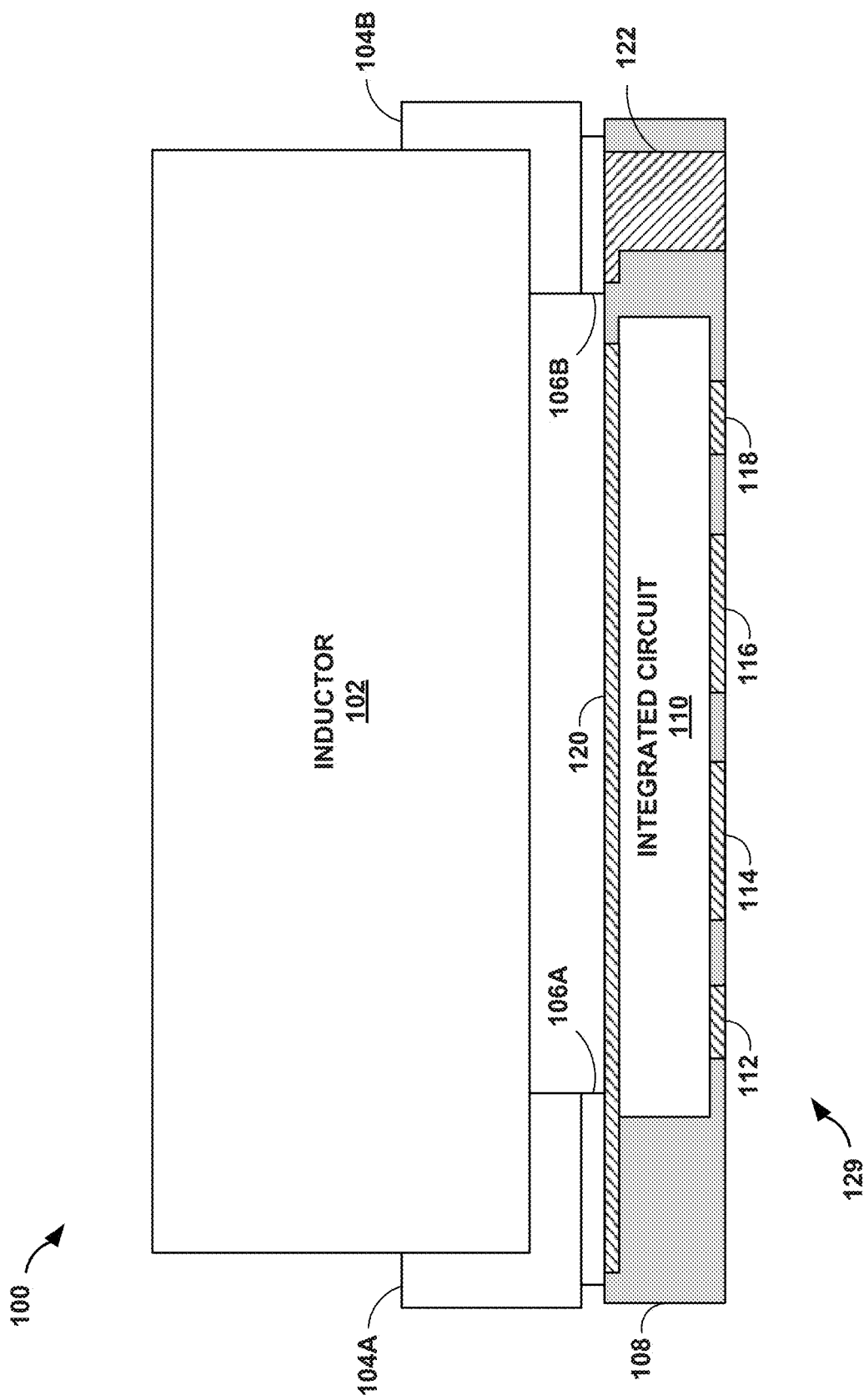
FIG. 4 is a side-view diagram of a device comprising an IC, an inductor, and at least five electrical connections on a side, in accordance with some examples of this disclosure.

FIG. 4 is a side-view diagram of a device 100 comprising an IC 110, an inductor 102, and at least five electrical connections 112, 114, 116, 118, 122 on a side 129, in accordance with some examples of this disclosure. Side 129 of device 100 may be mounted on or attached to a printed circuit board (PCB) (not shown in FIG. 4), such that insulating layer 108 and electrical connections 112, 114, 116, 118, 122 attach to the PCB.

Inductor 102 may include leads 104A, 104B which may conduct electricity with and support inductor 102. Leads 104A, 104B may comprise inductor terminals for electrically connecting inductor 102 to other components. Leads 104A, 104B may attach to conductive material 120 and electrical connection 122 by respective connectors 106A, 106B. Connectors 106A, 106B may comprise solder, electrically conductive paste or adhesive, or any other suitable material for securing leads 104A, 104B to conductive material 120 and electrical connection 122.

Conductive material 120 may operate in a manner similar to switch node 14 in FIG. 1, switch node 64 in FIG. 2, and/or clip 84 in FIG. 3. Conductive material 120 may comprise a clip, a metallization layer, a ribbon, a wire bond, and/or any other suitable conductive material. Conductive material 120 may be partially encapsulated in insulating layer 108 for electrical insulation and partially exposed for improved thermal dissipation. Electrical connection 122 may comprise a metallization layer, a stud, a copper pillar, a plated-through hole (PTH), and/or any other suitable conductive material. A PTH of this disclosure may comprise a conductive path with metal plating through insulating layer 108. Insulating layer 108 may comprise a laminate substrate, a molding compound, a chip-embedded substrate, an encapsulating material, or any other suitable insulating material. Insulating layer 108 may be covered with a dielectric material such as a solder mask, a solder resist material, a glass fiber, and/or an epoxy material such as molding compound.

Electrical connections 112, 114, 116, 118 may comprise control terminals for transistors in IC 110. Electrical connections 112, 114, 116, 118 may also comprise a drain terminal for a high-side transistor and a source terminal for a low-side transistor. Electrical connection 122 may comprise an output node similar to output node 18 in FIG. 1. Electrical connection 122 may be electrically isolated from IC 110 and be configured to deliver an output signal of device 100. The output signal from electrical connection 122 may comprise a voltage amplitude that is less than a voltage amplitude of the input voltage received by IC 110.

In accordance with the techniques of this disclosure, device 100 may comprise at least five electrical connections 112, 114, 116, 118, 122 on side 129. With five electrical connections 112, 114, 116, 118, 122 on side 129, device 100 may be easily attached to a PCB. Five electrical connections 112, 114, 116, 118, 122 on side 129 may simplify the design process for the larger system in which device 100 is located.

A device with fewer than five electrical connections on a side that attaches to a PCB may require additional components and connections to electrically connect the transistor terminals with external devices. By locating at least five electrical connections 112, 114, 116, 118, 122 on side 129, electrical connections 112, 114, 116, 118, 122 may connect to traces in a PCB. Vertical transistors may allow the switch node, such as conductive material 120, to be located on the top side of IC 110, while at least five electrical connections 112, 114, 116, 118, 122 are exposed on side 129. Lateral transistors with both load terminals on the same side of IC 110 may not allow for the design advantages of device 100.

Figure 5:
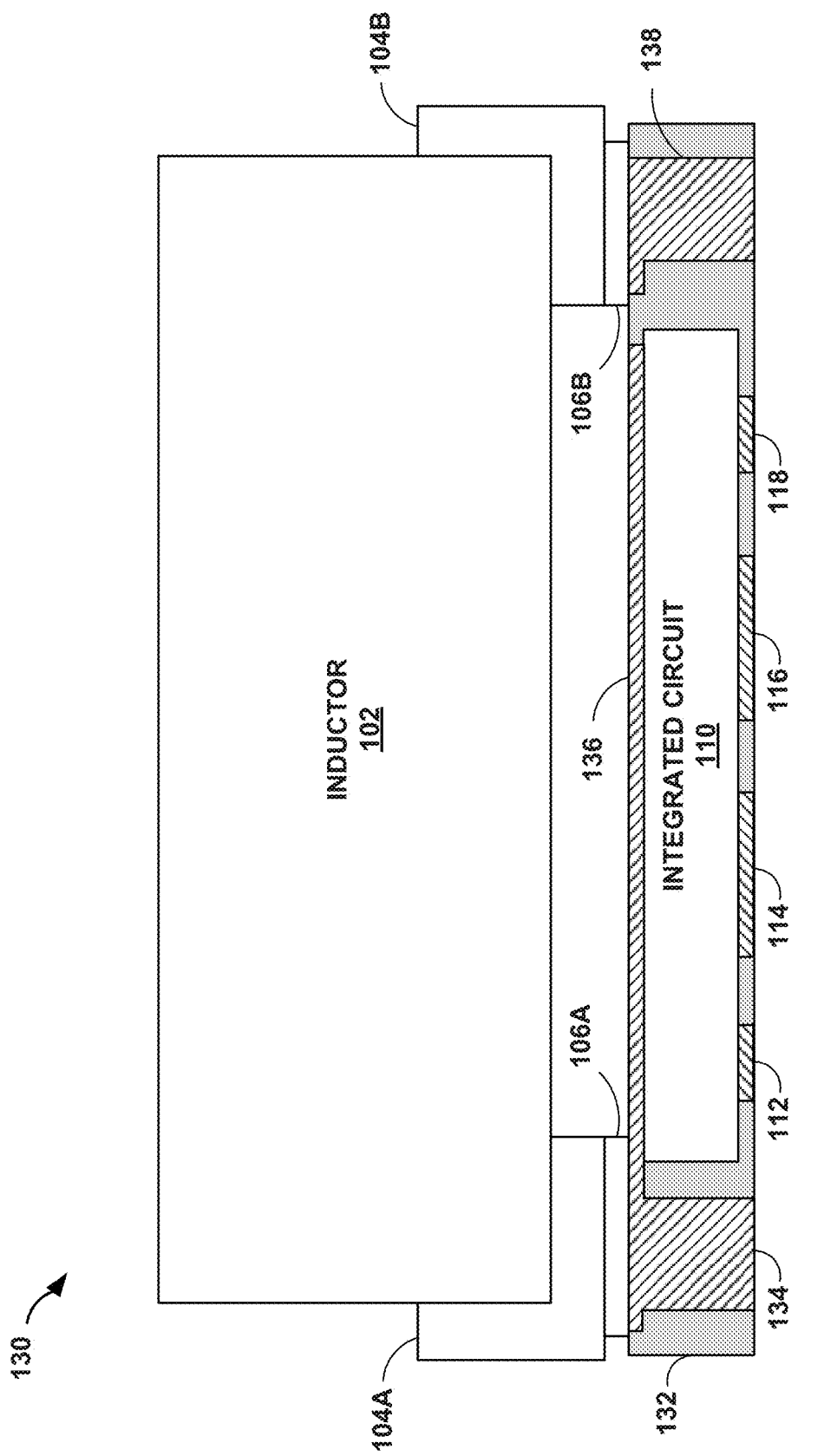
FIG. 5 is a side-view diagram of a device comprising an IC, an inductor, and at least five electrical connections on a side, in accordance with some examples of this disclosure.

FIG. 5 is a side-view diagram of a device 130 comprising an IC 110, an inductor 102, and at least five electrical connections 112, 114, 116, 118, 134, 138 on a side 139, in accordance with some examples of this disclosure. Side 139 of device 130 may be mounted on or attach to a PCB (not shown in FIG. 5), such that insulating layer 132 and electrical connections 112, 114, 116, 118, 134, 138 attach to the PCB. In some examples, inductor 102 may have a larger footprint than IC 110, so that IC 110 may be located between leads 104A, 104B, and connectors 106A, 106B may attach directly to the PCB.

Conductive material 136 and electrical connection 134 may operate in a manner similar to switch node 14 in FIG. 1, switch node 64 in FIG. 2, clip 84 in FIG. 3, and/or conductive material 120 in FIG. 4. Electrical connection 134 may comprise an electrical connection to the source terminal of the high-side transistor in IC 110, the drain terminal of the low-side transistor in IC 110, and lead 104A. Electrical connection 134 may be electrically isolated from IC 110. Conductive material 136 may comprise a clip, a metallization layer, a ribbon, a wire bond, and/or any other suitable conductive material. Conductive material 136 may be electrically connected to electrical connection 134 on side 139 through a metallization layer, a stud, a copper pillar, a PTH, and/or any other suitable conductive material. Electrical connection 138 may operate in a similar manner to electrical connection 122 in FIG. 4. Insulating layer 132 may comprise a laminate substrate, a molding compound, a chip-embedded substrate, an encapsulating material, or any other suitable insulating material. Electrical connection 138 may operate as an output node similar to output node 18 in FIG. 1, and electrical connection 138 may comprise a metallization layer, a stud, a copper pillar, a PHI, and/or any other suitable conductive material.

Figure 6:
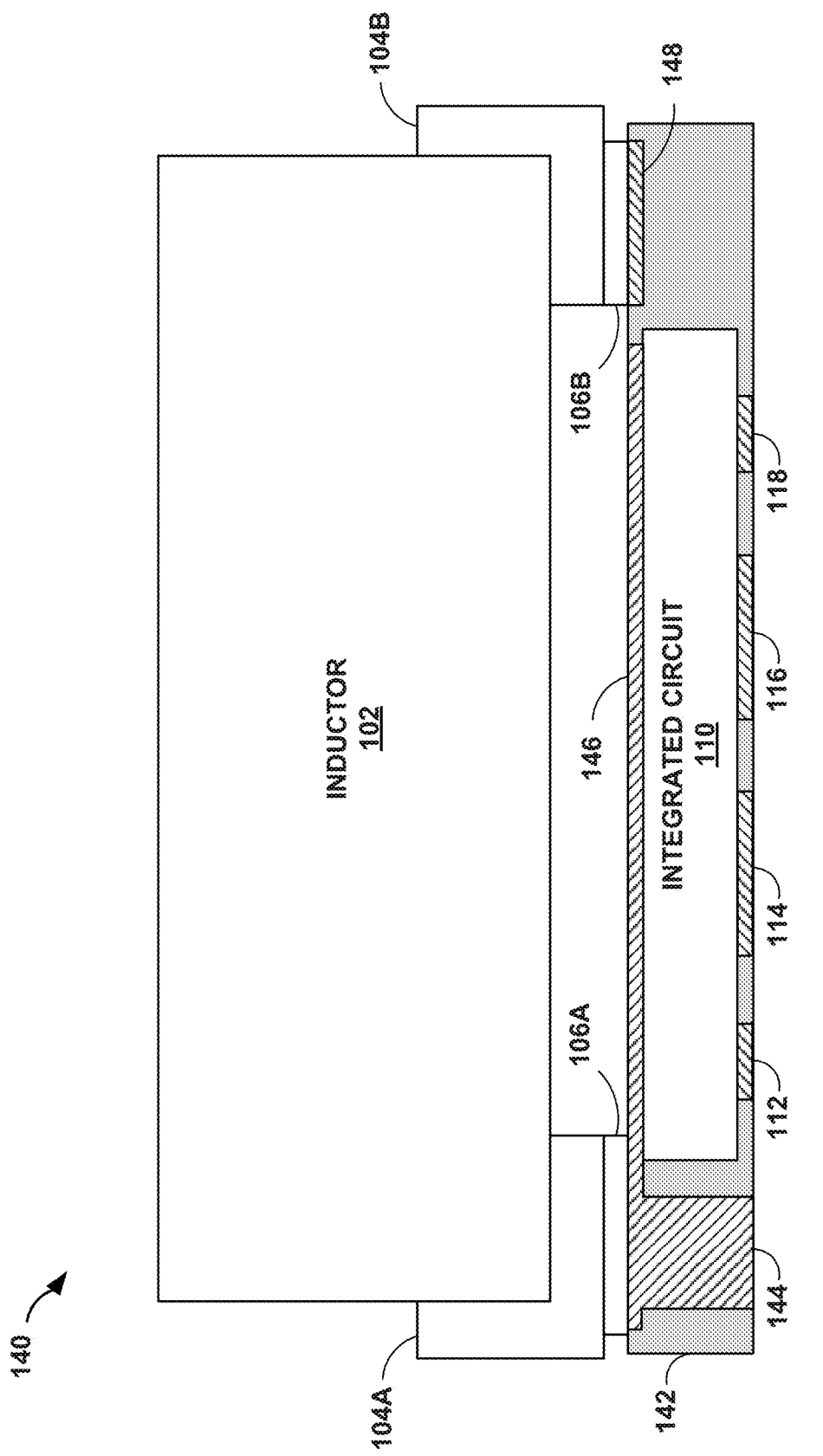
FIG. 6 is a side-view diagram of a device comprising an IC, an inductor, and at least five electrical connections on a side, in accordance with some examples of this disclosure.

FIG. 6 is a side-view diagram of a device 140 comprising an IC 110, an inductor 102, and at least five electrical connections 112, 114, 116, 118, 144 on a side 149, in accordance with some examples of this disclosure. Side 149 of device 140 may be mounted on or attach to a PCB (not shown in FIG. 6), such that insulating layer 142 and electrical connections 112, 114, 116, 118, 144 attach to the PCB.

Conductive material 146 and electrical connection 144 may operate in a manner similar to switch node 14 in FIG. 1, switch node 64 in FIG. 2, clip 84 in FIG. 3, conductive material 120 in FIG. 4, and/or conductive material 136 in FIG. 5. Electrical connection 144 may comprise an electrical connection to the source terminal of the high-side transistor in IC 110, the drain terminal of the low-side transistor in IC 110, and lead 104A. Conductive material 146 may comprise a clip, a metallization layer, a ribbon, a wire bond, and/or any other suitable conductive material. Conductive material 146 may be electrically connected to electrical connection 144 through a metallization layer, a stud, a copper pillar, a PTH, and/or any other suitable conductive material. Electrical connection 148 may extend into or out of the page in FIG. 6 to connect to an internal or external component. Electrical connection 148 may be electrically isolated from IC 110. Insulating layer 142 may comprise a laminate substrate, a molding compound, a chip-embedded substrate, an encapsulating material, or any other suitable insulating material.

Figure 7:
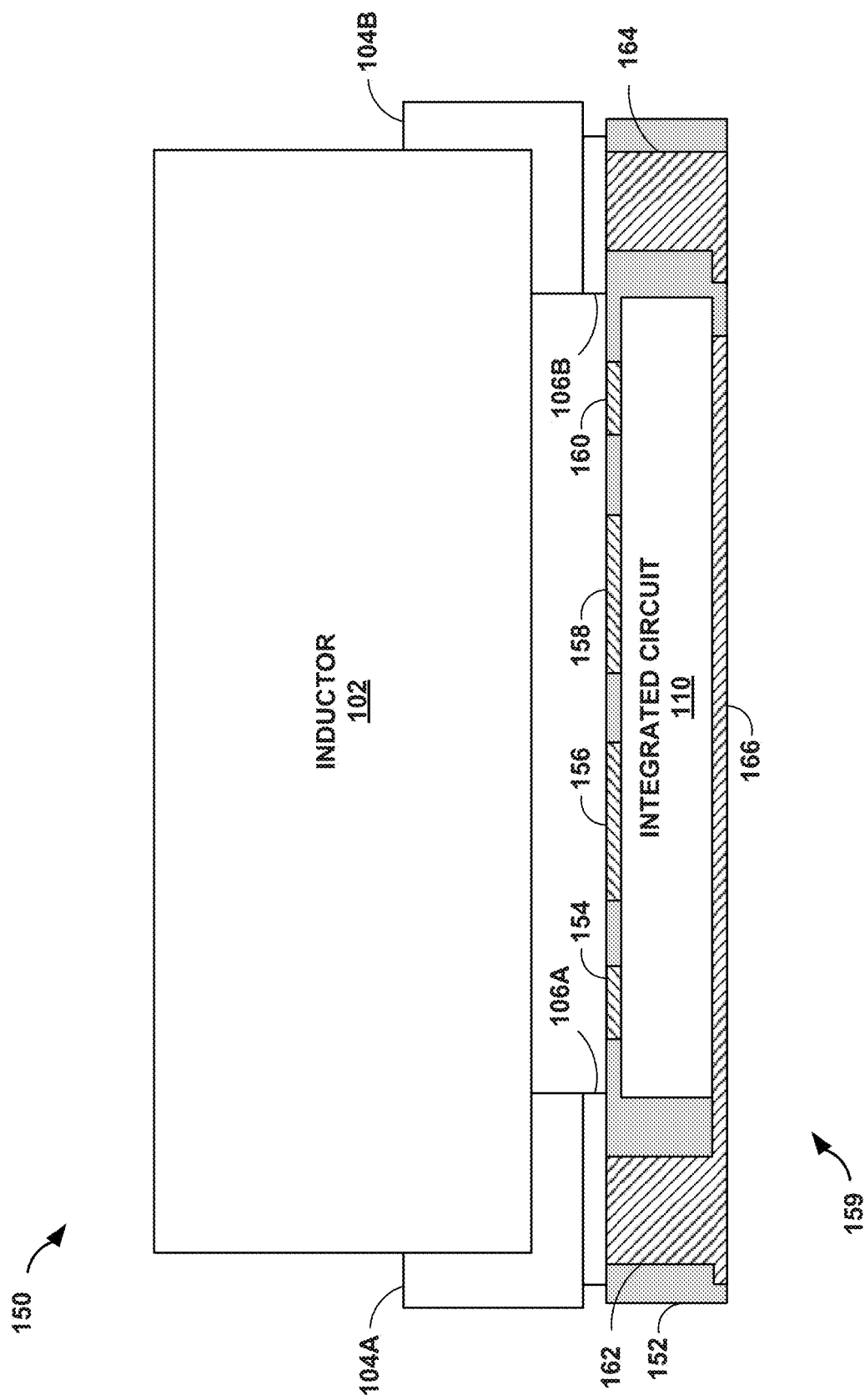
FIG. 7 is a side-view diagram of a device comprising an IC and an inductor, in accordance with some examples of this disclosure.

FIG. 7 is a side-view diagram of a device 150 comprising an IC 110 and an inductor 102, in accordance with some examples of this disclosure. Although not depicted in FIG. 7, device 150 may comprise at least five electrical connections on side 159 if electrical connections 154, 156, 158, 160 are electrical connected to side 159 into or out of the page in FIG. 7. Side 159 of device 150 may be mounted on or attach to a PCB (not shown in FIG. 7), such that insulating layer 152 and electrical connections 164, 166 attach to the PCB. One or more of electrical connections 154, 156, 158, 160 may attach to the PCB through a connection to side 159 into or out of the page in FIG. 7.

Conductive material 162 and electrical connection 166 may operate in a manner similar to switch node 14 in FIG. 1, switch node 64 in FIG. 2, clip 84 in FIG. 3, conductive material 120 in FIG. 4, conductive material 136 in FIG. 5, and/or conductive material 146 in FIG. 6. Electrical connection 166 may comprise an electrical connection to the source terminal of the high-side transistor in IC 110, the drain terminal of the low-side transistor in IC 110, and lead 104A. Electrical connection 166 may comprise a clip, a metallization layer, a ribbon, a wire bond, and/or any other suitable conductive material. Conductive material 162 may be electrically connected to electrical connection 166. Each of conductive material 162 and electrical connection 164 may comprise a metallization layer, a stud, a copper pillar, a PTH, and/or any other suitable conductive material. Electrical connection 164 may be electrically isolated from IC 110. Insulating layer 152 may comprise a laminate substrate, a molding compound, a chip-embedded substrate, an encapsulating material, or any other suitable insulating material.

Figure 8:
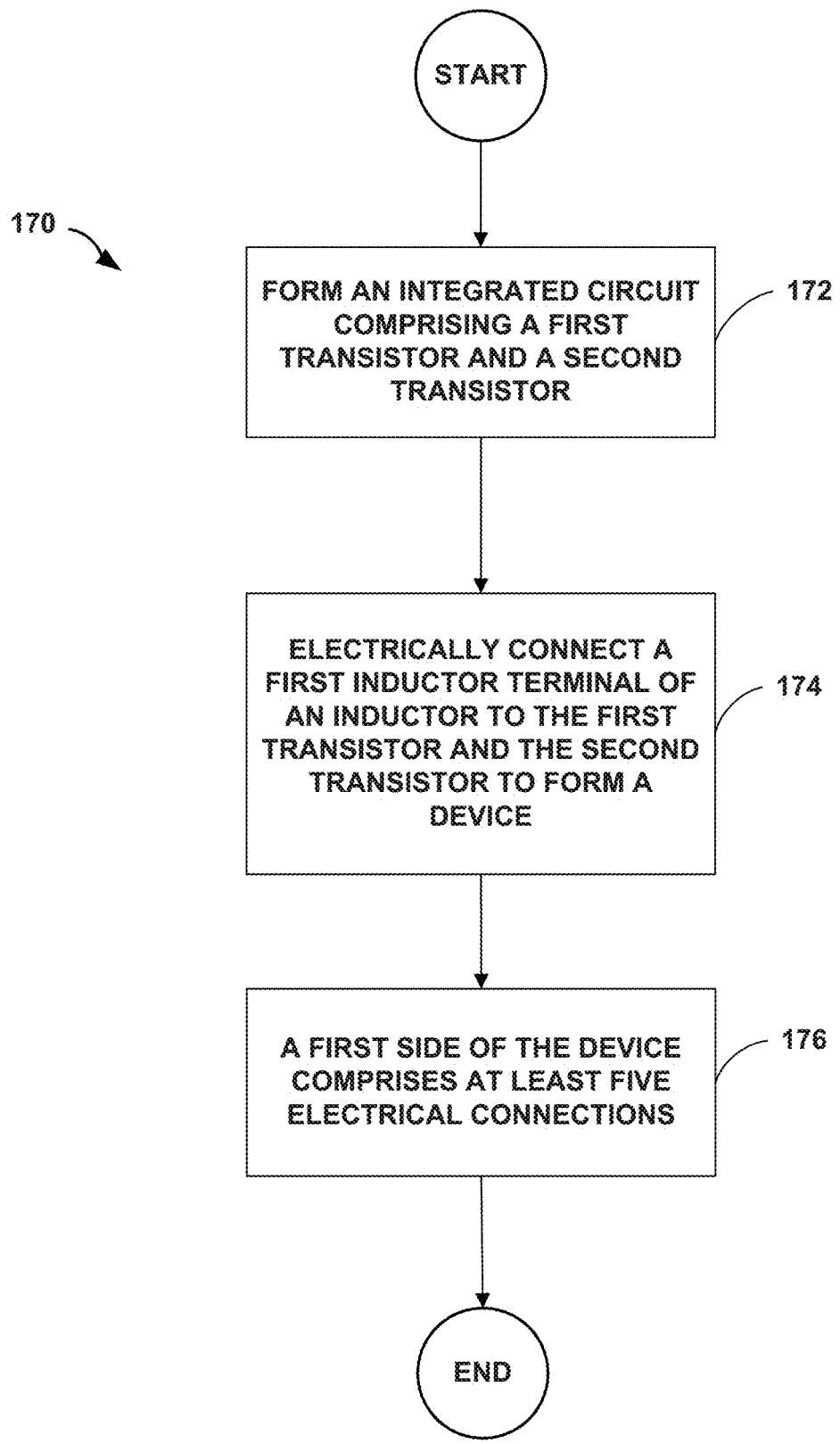
FIG. 8 is a flowchart illustrating an example technique for constructing a device comprising at least five electrical connections on a side, in accordance with some examples of this disclosure.

FIG. 8 is a flowchart illustrating an example technique 170 for constructing a device comprising at least five electrical connections on a side, in accordance with some examples of this disclosure. Technique 170 is described with reference to device 100 in FIG. 4, although other components, such as devices 130, 140, 150 in FIGS. 5-7, may exemplify similar techniques.

The technique of FIG. 8 includes forming an IC 110 comprising a first transistor and a second transistor (172). The first transistor may comprise a high-side transistor, and the second transistor may comprise a low-side transistor. The two transistors may comprise power vertical FETs or any other suitable transistors configured to operate as a half-bridge circuit.

The technique of FIG. 8 further includes electrically connecting a first inductor terminal 104A of an inductor 102 to the first transistor and the second transistor to form a device (174). The first inductor terminal, i.e., lead 104A, may electrically connect to the source terminal of the first transistor and the drain terminal of the second transistor. The connection between the first inductor terminal, the first transistor, and the second transistor may comprise conductive material 120, which may operate as a switch node.

As part of the technique of FIG. 8, side 129 of device 100 comprises at least five electrical connections 112, 114, 116, 118, 122 (176). Electrical connections 112, 114, 116, 118 may comprise terminals for the transistors in IC 110. Electrical connection 122 may comprise an output node. If device 100 attaches to a PCB, electrical connections 112, 114, 116, 118, 122 may electrically connect to traces in the PCB.

The following numbered examples demonstrate one or more aspects of the disclosure.

Example 1

A device comprises an IC comprising a first transistor and a second transistor. The device further comprises an inductor comprising a first inductor terminal and a second inductor terminal, wherein the first inductor terminal is electrically connected to the first transistor and the second transistor. The device further comprises at least five electrical connections on a first side of the device.

Example 2

The device of example 1, wherein the at least five electrical connections comprise a first electrical connection to a first control terminal of the first transistor, a second electrical connection to a second control terminal of the second transistor, a third electrical connection to a first drain terminal of the first transistor, and a fourth electrical connection to a second source terminal of the second transistor.

Example 3

The device of example 1 or 2 or combinations thereof, wherein the at least five electrical connections comprise a fifth electrical connection to the second inductor terminal of the inductor.

Example 4

The device of any one of examples 1 to 3 or combinations thereof, wherein the at least five electrical connections comprise a sixth electrical connection to a first source terminal of the first transistor, a second drain terminal of the second transistor, and the first inductor terminal.

Example 5

The device of any one of examples 1 to 4 or combinations thereof, further comprising an insulating layer attached to the IC, wherein the fifth electrical connection comprises a conductive path through the insulating layer between the first side of the device and the second inductor terminal, and the conductive path is electrically isolated from the IC.

Example 6

The device of any one of examples 1 to 5 or combinations thereof, wherein the first electrical connection is configured to receive driver signals, the second electrical connection is configured to receive driver signals, the third electrical connection is configured to receive an input signal, the fourth electrical connection is configured to connect to a reference voltage, and the fifth electrical connection is configured to deliver an output signal.

Example 7

The device of any one of examples 1 to 6 or combinations thereof, wherein the device is configured to operate as a half-bridge power converter; the first side of the device is configured to attach to a printed circuit board; the input signal is a direct-current (DC) electricity signal; the output signal is a DC electricity signal; and a voltage amplitude of the input signal is higher than a voltage amplitude of the output signal.

Example 8

The device of any one of examples 1 to 7 or combinations thereof, wherein the at least five electrical connections comprise a fifth electrical connection to a first source terminal of the first transistor, a second drain terminal of the second transistor, and the first inductor terminal.

Example 9

The device of any one of examples 1 to 8 or combinations thereof, wherein the first transistor comprises a first vertical power transistor comprising a first control terminal on the first side of the IC; a first drain terminal on the first side of the IC; and a first source terminal on the second side of the IC; the second transistor comprises a second vertical power transistor comprising a second control terminal on the first side of the IC; a second drain terminal on the second side of the IC; and a second source terminal on the first side of the IC; and the first inductor terminal is electrically connected to the first source terminal and the second drain terminal.

Example 10

A method comprises forming an IC comprising a first transistor and a second transistor. The method further comprises electrically connecting a first inductor terminal of an inductor to the first transistor and the second transistor to form a device. A first side of the device comprises at least five electrical connections.

Example 11

The method of example 10, further comprising electrically connecting a first electrical connection of the at least five electrical connections to a first control terminal of the first transistor. The method further comprises electrically connecting a second electrical connection of the at least five electrical connections to a second control terminal of the second transistor. The method further comprises electrically connecting a third electrical connection of the at least five electrical connections to a first drain terminal of the first transistor. The method further comprises electrically connecting a fourth electrical connection of the at least five electrical connections to a second source terminal of the second transistor.

Example 12

The method of example 10 or 11 or combinations thereof, further comprising electrically connecting a fifth electrical connection of the at least five electrical connections to a second inductor terminal of the inductor.

Example 13

The method of any one of examples 10 to 12 or combinations thereof, further comprising electrically connecting a sixth electrical connection of the at least five electrical connections to a first source terminal of the first transistor, a second drain terminal of the second transistor, and the first inductor terminal.

Example 14

The method of any one of examples 10 to 13 or combinations thereof, further comprising attaching an insulating layer to the IC, wherein electrically connecting the fifth electrical connection comprises forming a conductive path in the insulating layer; and the conductive path is electrically isolated from the IC.

Example 15

The method of any one of examples 10 to 14 or combinations thereof, wherein the first electrical connection is configured to receive driver signals; the second electrical connection is configured to receive driver signals; the third electrical connection is configured to receive an input signal; the fourth electrical connection is configured to connect to a reference voltage; and the fifth electrical connection is configured to deliver an output signal.

Example 16

The method of any one of examples 10 to 15 or combinations thereof, wherein the device is configured to operate as a half-bridge power converter; the first side of the device is configured to attach to a printed circuit hoard; the input signal is a direct-current (DC) electricity signal; the output signal is a DC electricity signal; and a voltage amplitude of the input signal is higher than a voltage amplitude of the output signal.

Example 17

The method of any one of examples 10 to 16 or combinations thereof, further comprising electrically connecting a fifth electrical connection of the at least five electrical connections to a first source terminal of the first transistor, a second drain terminal of the second transistor, and the first inductor terminal.

Example 18

A power-converter device comprising an IC comprising a first vertical power transistor and a second vertical power transistor, wherein the first vertical power transistor comprises a first control terminal, a first drain terminal, and a first source terminal, and the second vertical power transistor comprises a second control terminal, a second drain terminal, and a second source terminal. The power-converter device further comprises an inductor comprising a first inductor terminal and a second inductor terminal, wherein the first inductor terminal is electrically connected to the first source terminal and the second drain terminal. The power-converter device further comprises at least five electrical connections on a first side of the power-converter device, wherein the at least five electrical connections comprise a first electrical connection to the first control terminal, a second electrical connection to the second control terminal, a third electrical connection to the first drain terminal, and a fourth electrical connection to the second source terminal.

Example 19

The power-converter device of example 18, wherein the at least five electrical connections comprise a fifth electrical connection to the second inductor terminal; the first electrical connection is configured to receive driver signals. The second electrical connection is configured to receive driver signals, and the third electrical connection is configured to receive an input direct-current (DC) electricity signal. The fourth electrical connection is configured to connect to a reference voltage, and the fifth electrical connection is configured to deliver an output DC electricity signal. A voltage amplitude of the input DC electricity signal is higher than a voltage amplitude of the output DC electricity signal.

Example 20

The power-converter device of example 18 or 19 or combinations thereof, further comprising an insulating layer attached to the IC, wherein the at least five electrical connections comprise a sixth electrical connection to the first source terminal, the second drain terminal, and the first inductor terminal. The fifth electrical connection comprises a first conductive path through the insulating layer between the first side of the power-converter device and the second inductor terminal; the first conductive path is electrically isolated from the IC. The first side of the device is configured to attach to a printed circuit board, and the sixth electrical connection comprises a second conductive path through the insulating layer between the first side of the power-converter device and the first inductor terminal.

Various examples of the disclosure have been described. Any combination of the described systems, operations, or functions is contemplated. These and other examples are within the scope of the following claims.

What is claimed is:

1. A device comprising:
   an integrated circuit (IC) comprising:
      a first vertical power transistor including:
         a first control terminal on a first side of the IC;
         a first drain terminal on the first side of the IC; and
         a first source terminal on a second side of the IC; and
      a second vertical power transistor including:
         a second control terminal on the first side of the IC;
         a second drain terminal on the second side of the IC; and
         a second source terminal on the first side of the IC;
   an inductor comprising a first inductor terminal and a second inductor terminal, wherein the first inductor terminal is electrically connected to the first source terminal and the second drain terminal; and
   at least five electrical connections on a first side of the device, wherein the at least five electrical connections comprise an electrical connection to the second inductor terminal of the inductor.

2. The device of claim 1, wherein the electrical connection to the second inductor terminal comprises a fifth electrical connection on the first side of the device, and wherein the at least five electrical connections further comprise:
   a first electrical connection to the first control terminal;
   a second electrical connection to the second control terminal;
   a third electrical connection to the first drain terminal; and
   a fourth electrical connection to the second source terminal.

3. The device of claim 2, further comprising an insulating layer attached to the IC, wherein: the fifth electrical connection comprises a conductive path through the insulating layer between the first side of the device and the second inductor terminal, and the conductive path is electrically isolated from the IC.

4. The device of claim 3, wherein the conductive path comprises a metallization layer, a stud, a copper pillar, or a plated-through hole.

5. The device of claim 3, wherein the second inductor terminal comprises a lead, wherein the lead is electrically connected to the conductive path by solder, electrically conductive paste, or adhesive.

6. The device of claim 2, wherein:
   the first electrical connection is configured to receive first driver signals;
   the second electrical connection is configured to receive second driver signals;
   the third electrical connection is configured to receive an input signal;
   the fourth electrical connection is configured to connect to a reference voltage; and
   the fifth electrical connection is configured to deliver an output signal.

7. The device of claim 6, wherein:
   the device is configured to operate as a half-bridge power converter;
   the first side of the device is configured to attach to a printed circuit board;
   the input signal is a direct-current (DC) electricity signal;
   the output signal is a DC electricity signal; and
   a voltage amplitude of the input signal is higher than a voltage amplitude of the output signal.

8. The device of claim 2, wherein the at least five electrical connections comprise a sixth electrical connection to the first source terminal, the second drain terminal, and the first inductor terminal.

9. The device of claim 1, wherein the at least five electrical connections comprise a sixth electrical connection to the first source terminal, the second drain terminal, and the first inductor terminal.

10. The device of claim 1, wherein the first vertical power transistor and the second vertical power transistor are integrated into a single substrate.

11. A method comprising:
   forming an integrated circuit (IC) comprising a first vertical power transistor including a first control terminal on a first side of the IC, a first drain terminal on the first side of the IC, and a first source terminal on a second side of the IC and a second vertical power transistor including a second control terminal on the first side of the IC, a second drain terminal on the second side of the IC, and a second source terminal on the first side of the IC;
   electrically connecting a first inductor terminal of an inductor to the first source terminal and the second drain terminal to form a device, wherein a first side of the device comprises at least five electrical connections; and
   electrically connecting an electrical connection of the at least five electrical connections to a second inductor terminal of the inductor.

12. The method of claim 11, wherein the electrical connection to the second inductor terminal comprises a fifth electrical connection on the first side of the device, the method further comprising:
   electrically connecting a first electrical connection of the at least five electrical connections to the first control terminal;
   electrically connecting a second electrical connection of the at least five electrical connections to the second control terminal;
   electrically connecting a third electrical connection of the at least five electrical connections to the first drain terminal; and
   electrically connecting a fourth electrical connection of the at least five electrical connections to the second source terminal.

13. The method of claim 12, further comprising attaching an insulating later to the IC, wherein: electrically connecting the fifth electrical connection comprises forming a conductive path in the insulating layer; and the conductive path is electrically isolated from the IC.

14. The method of claim 12, wherein:
   the first electrical connection is configured to receive first driver signals;
   the second electrical connection is configured to receive second driver signals;
   the third electrical connection is configured to receive an input signal;

the fourth electrical connection is configured to connect to a reference voltage; and the fifth electrical connection is configured to deliver an output signal.

15. The method of claim 14, wherein:

the device is configured to operate as a half-bridge power converter;

the first side of the device is configured to attach to a printed circuit board;

the input signal is a direct-current (DC) electricity signal;

the output signal is a DC electricity signal; and a voltage amplitude of the input signal is higher than a voltage amplitude of the output signal.

16. The method of claim 12, further comprising electrically connecting a sixth electrical connection of the at least five electrical connections to the first source terminal, the second drain terminal, and the first inductor terminal.

17. The method of claim 11, further comprising electrically connecting a sixth electrical connection of the at least five electrical connections to the first source terminal, the second drain terminal, and the first inductor terminal.

18. The method of claim 11, wherein the first vertical power transistor and the second vertical power transistor are integrated into a single substrate.

19. A power-converter device comprising:

an integrated circuit (IC) comprising a first vertical power transistor and a second vertical power transistor, wherein:

the first vertical power transistor comprises a first control terminal, a first drain terminal, and a first source terminal, and the second vertical power transistor comprises a second control terminal, a second drain terminal, and a second source terminal;

an inductor comprising a first inductor terminal and a second inductor terminal, wherein the first inductor terminal is electrically connected to the first source terminal and the second drain terminal; and at least five electrical connections on a first side of the power-converter device, wherein the at least five electrical connections comprise:

a first electrical connection to the first control terminal;

a second electrical connection to the second control terminal;

a third electrical connection to the first drain terminal;

a fourth electrical connection to the second source terminal; and a fifth electrical connection to the second inductor terminal of the inductor.

20. The power-converter device of claim 19, wherein:

the first electrical connection is configured to receive first driver signals;

the second electrical connection is configured to receive second driver signals;

the third electrical connection is configured to receive an input direct-current (DC) electricity signal;

the fourth electrical connection is configured to connect to a reference voltage;

the fifth electrical connection is configured to deliver an output DC electricity signal; and a voltage amplitude of the input DC electricity signal is higher than a voltage amplitude of the output DC electricity signal.

21. The power-converter device of claim 19, further comprising an insulating layer attached to the IC, wherein:

the at least five electrical connections comprise a sixth electrical connection to the first source terminal, the second drain terminal, and the first inductor terminal;

the fifth electrical connection comprises a first conductive path through the insulating layer between the first side of the power-converter device and the second inductor terminal;

the first conductive path is electrically isolated from the IC;

the first side of the device is configured to attach to a printed circuit board; and the sixth electrical connection comprises a second conductive path through the insulating layer between the first side of the power-converter device and the first inductor terminal.

\* \* \* \* \*